(12) United States Patent
Kasahara et al.

(10) Patent No.: US 11,431,343 B2
(45) Date of Patent: Aug. 30, 2022

(54) OSCILLATOR, ELECTRONIC APPARATUS, AND VEHICLE

(71) Applicant: Seiko Epson Corporation, Toyko (JP)

(72) Inventors: Shoichiro Kasahara, Minowa (JP); Hisahiro Ito, Minowa (JP); Shinya Aoki, Minowa (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 17/333,078

(22) Filed: May 28, 2021

(65) Prior Publication Data

US 2021/0376840 A1 Dec. 2, 2021

(30) Foreign Application Priority Data

May 29, 2020 (JP) .............................. JP2020-094000

(51) Int. Cl.
| | | |
|---|---|---|
| *H03B 5/32* | (2006.01) | |
| *H01L 41/053* | (2006.01) | |
| *H01L 41/083* | (2006.01) | |
| *H03H 9/10* | (2006.01) | |
| *H03L 7/099* | (2006.01) | |
| *H03K 5/26* | (2006.01) | |
| *H03K 5/00* | (2006.01) | |
| *H03H 9/05* | (2006.01) | |

(52) U.S. Cl.
CPC ............ *H03L 7/099* (2013.01); *H01L 41/053* (2013.01); *H01L 41/083* (2013.01); *H03B 5/32* (2013.01); *H03H 9/0547* (2013.01); *H03H 9/10* (2013.01); *H03K 5/00006* (2013.01); *H03K 5/26* (2013.01); *H03B 2200/0022* (2013.01); *H03B 2202/084* (2013.01)

(58) Field of Classification Search
CPC ..... H01L 41/053; H01L 41/083; H01L 41/23; H01L 41/311; H03B 5/30; H03B 5/32; H03B 2200/0022; H03B 2202/084; H03H 9/05; H03H 9/0538; H03H 9/0547; H03H 9/10; H03H 9/131; H03H 9/19; H03H 9/21; H03H 9/215
See application file for complete search history.

(56) References Cited

U.S. PATENT DOCUMENTS

| | | | | |
|---|---|---|---|---|
| 6,445,254 | B1* | 9/2002 | Shibuya ................... | H03B 5/32 257/701 |
| 7,378,780 | B2* | 5/2008 | Mizumura ........... | H03H 9/0552 310/341 |
| 2005/0055814 | A1* | 3/2005 | Hatanaka ............. | H03H 9/0552 29/25.35 |
| 2005/0184625 | A1* | 8/2005 | Miyazaki ............. | H03H 9/1021 310/348 |

(Continued)

FOREIGN PATENT DOCUMENTS

JP 2016-052083 A 4/2016

*Primary Examiner* — Levi Gannon
(74) *Attorney, Agent, or Firm* — Harness, Dickey & Pierce, P.L.C.

(57) ABSTRACT

In the oscillator, a quartz crystal resonator and an oscillation circuit formed in an IC incorporating an inductor are electrically coupled to each other with a resonator interconnection disposed on a surface of a substrate to form an oscillation loop. A conductor layer disposed as an intermediate layer of the substrate is disposed so as to overlap the resonator interconnection and not to overlap the inductor incorporated in the IC in a plan view.

9 Claims, 8 Drawing Sheets

(56) References Cited

U.S. PATENT DOCUMENTS

| | | | |
|---|---|---|---|
| 2005/0269911 A1* | 12/2005 | Usuda | H03B 5/32 |
| | | | 310/348 |
| 2007/0176690 A1* | 8/2007 | Sutardja | H03L 5/00 |
| | | | 331/8 |
| 2009/0091904 A1* | 4/2009 | Hatanaka | H03H 9/1021 |
| | | | 361/764 |
| 2016/0065170 A1* | 3/2016 | Takebayashi | H03H 9/131 |
| | | | 331/158 |
| 2017/0201230 A1* | 7/2017 | Nomura | H01F 5/04 |

\* cited by examiner

OSCILLATOR, ELECTRONIC APPARATUS, AND VEHICLE

The present application is based on, and claims priority from JP Application Serial Number 2020-094000, filed May 29, 2020, the disclosure of which is hereby incorporated by reference herein in its entirety.

BACKGROUND

1. Technical Field

The present disclosure relates to an oscillator, an electronic apparatus and a vehicle each equipped with an oscillator.

2. Related Art

In the past, there has been known an oscillator equipped with an oscillation circuit for outputting a signal with a desired frequency using a resonator element made of quartz crystal or the like. For example, in JP-A-2016-52083 (Document 1), there is disclosed an oscillator having a resonator element made of quartz crystal and an IC incorporating an oscillation circuit, and has a configuration in which interconnections constituting an oscillation loop which includes the resonator element and which is coupled to the oscillation circuit, and a conductor layer at a ground potential are stacked via a substrate made of ceramic.

The conductor layer at the ground potential overlaps the interconnections constituting the oscillation loop and the IC, and thus, stabilization of capacitances and oscillation characteristics is achieved. Further, in the present oscillation, there is housed an inductor as a discrete component in addition to the resonator element and the oscillation circuit.

The inductor installed in the oscillator in Document 1 is a discrete component, and is therefore mounted outside the IC. In order to reduce the oscillator in size, it is conceivable to form the inductor inside the IC like, for example, a spiral inductor. However, in such a case, there is a possibility that the magnetic field of the inductor is blocked by the conductor layer at the ground potential to thereby deteriorate the characteristics.

SUMMARY

An oscillator includes an integrated circuit element having an oscillation circuit to electrically be coupled to a resonator element, and an inductor, and a substrate having a first surface on which the integrated circuit element is disposed, and on which a resonator interconnection to be coupled to the resonator element and the oscillation circuit to constitute an oscillation loop is disposed, and a second surface as an opposite surface to the first surface, wherein the substrate has a conductor layer between the first surface and the second surface, and the conductor layer overlaps the resonator interconnection, and does not overlap the inductor in a plan view.

An electronic apparatus is equipped with the oscillator described above.

A vehicle is equipped with the oscillator described above.

DESCRIPTION OF EXEMPLARY EMBODIMENTS

1. Embodiment 1

Figure 1:
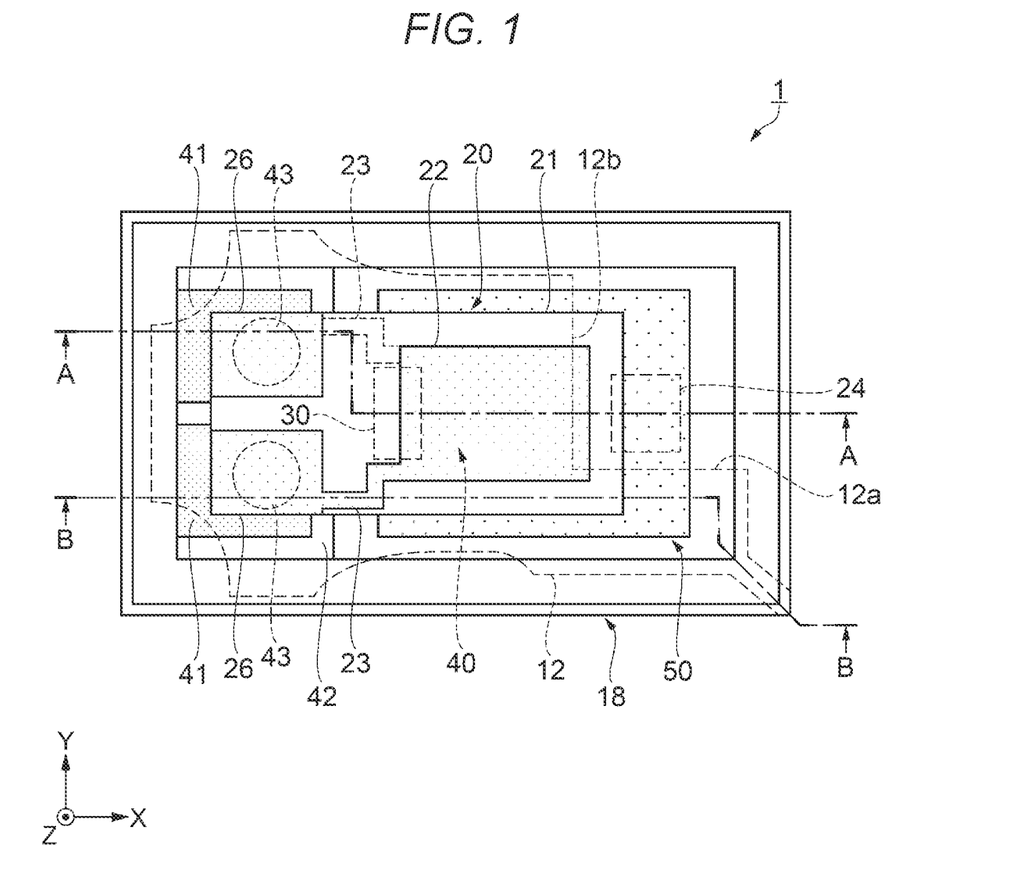
FIG. 1 is a see-through plan view of an internal configuration of an oscillator according to Embodiment 1 viewed from above.
Figure 7:
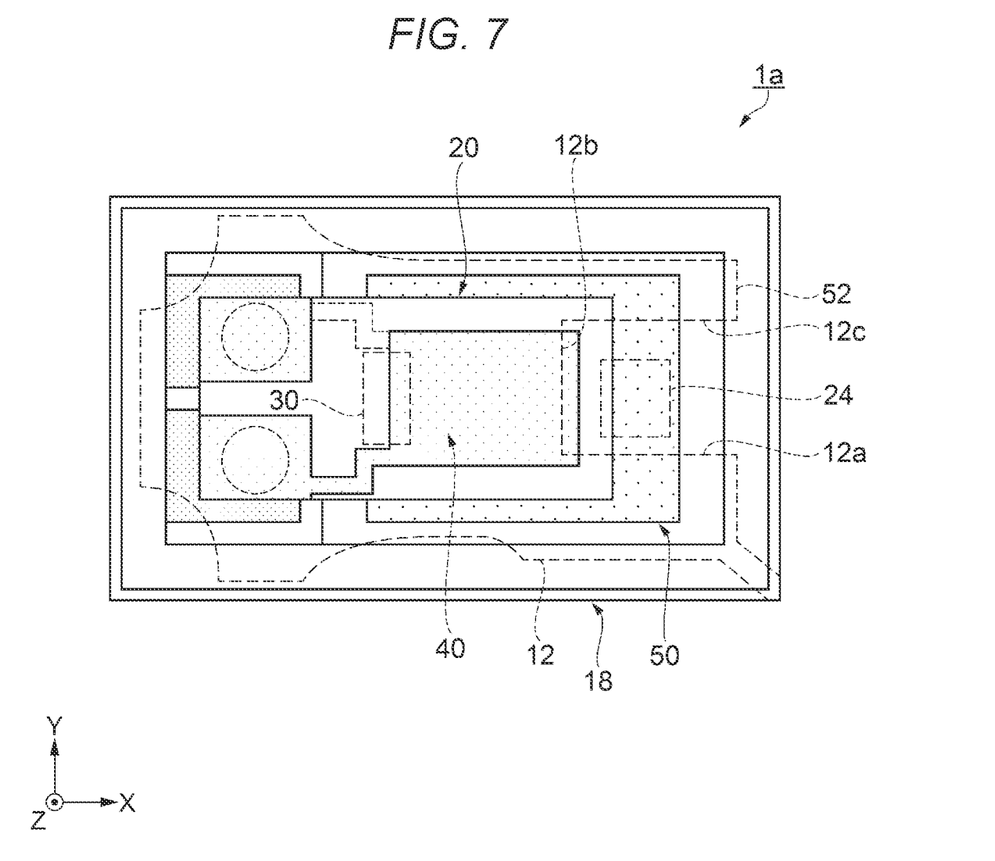
FIG. 7 is a see-through plan view of an internal configuration of an oscillator according to Embodiment 2 viewed from above.

First, an oscillator 1 according to Embodiment 1 is cited, and will be described with reference to FIG. 1 through FIG. 4. In FIG. 1 through FIG. 4, and in FIG. 7 showing Embodiment 2 described later, an X axis, a Y axis, and a Z axis are illustrated as three axes perpendicular to each other for the sake of convenience of explanation. As shown in FIG. 1, the oscillator 1 has a rectangular shape in a plan view, and a long side direction of the rectangular shape is defined as the X axis, and a short side direction is defined as the Y axis. In the X axis, a tip side of the arrow is defined as right or a right side, and a base end side thereof is defined as left or a left side. In the Y axis, a tip side of the arrow is defined as a back side, and a base end side thereof is also referred to as a front side. The Z axis represents a thickness or a height, a tip side of the arrow is referred to as an upper side, and a base end side thereof is defined as a bottom or a lower side in the description.

Figure 2:
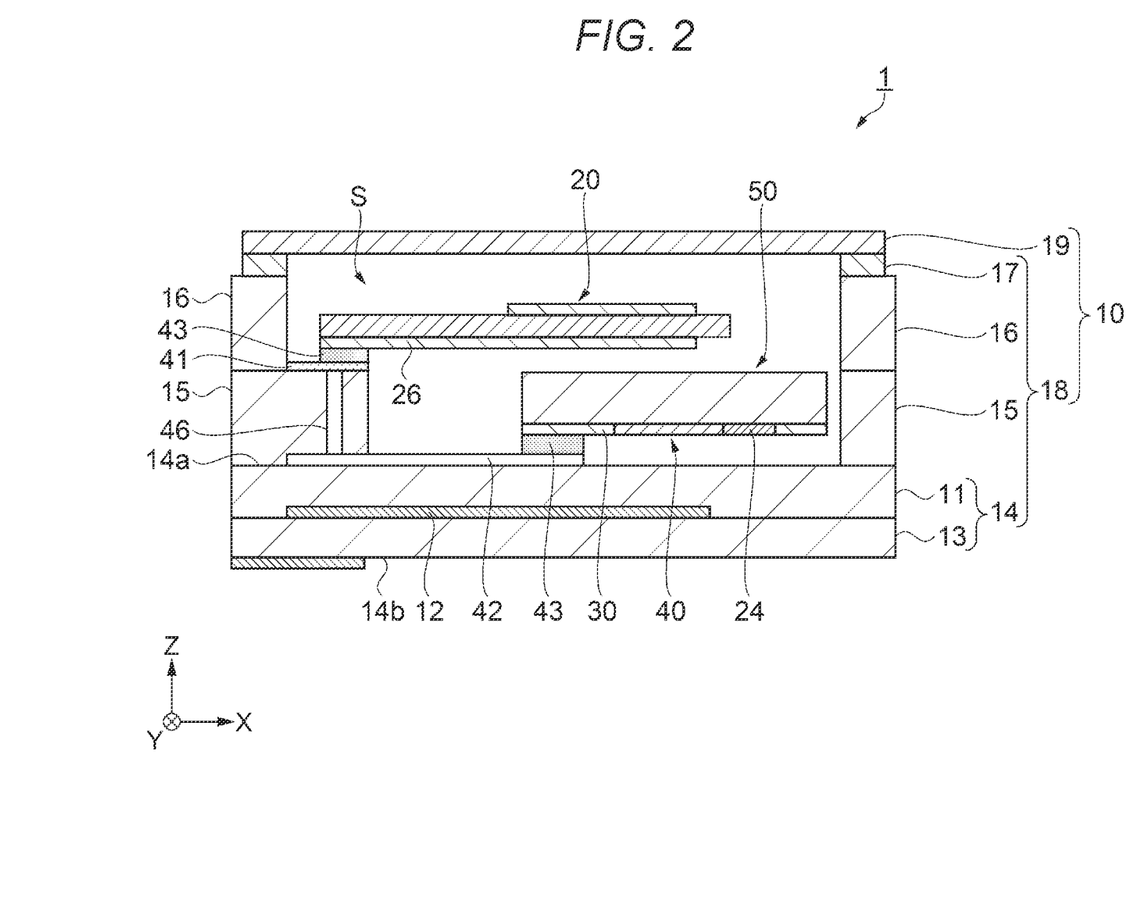
FIG. 2 is a cross-sectional view of the oscillator shown in FIG. 1 along the line A-A.
Figure 3:
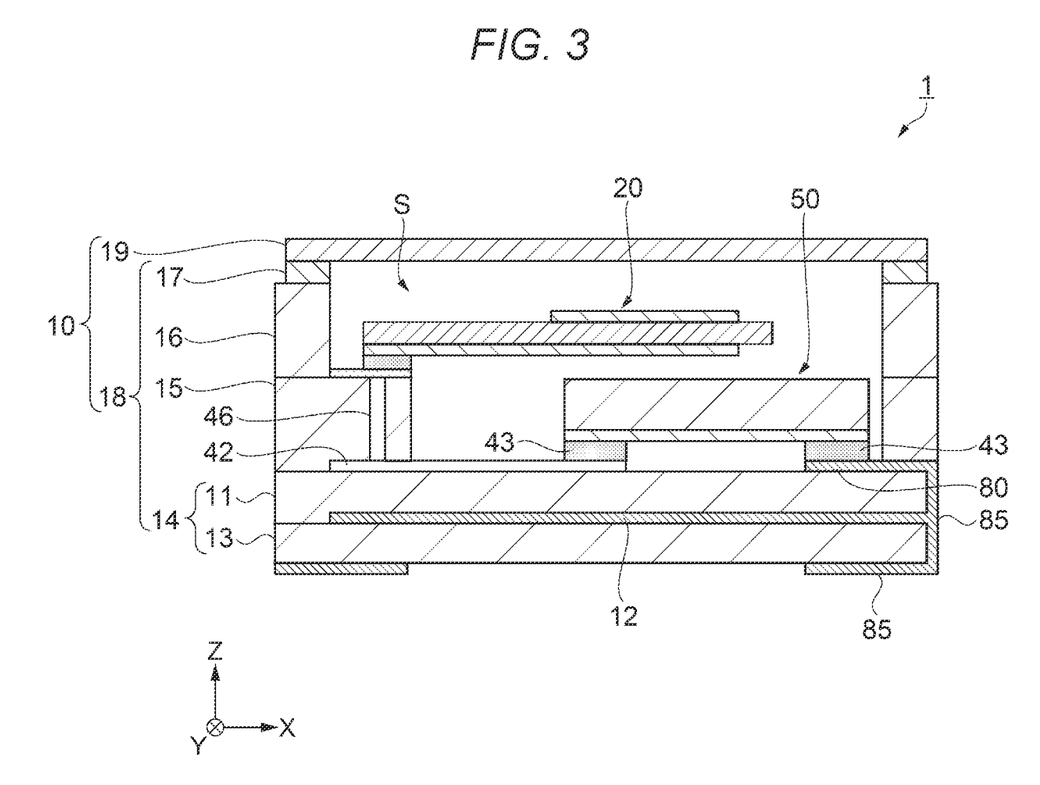
FIG. 3 is a cross-sectional view of the oscillator shown in FIG. 1 along the line B-B.

FIG. 1 is a see-through view viewed from above, and shows an internal configuration of the oscillator 1. A drawing in a plan view viewed from above is hereinafter referred to as a plan view. FIG. 2 is a cross-sectional view of the oscillator 1 shown in FIG. 1 along the line A-A. FIG. 3 is a cross-sectional view of the oscillator 1 shown in FIG. 1 along the line B-B.

Schematic Configuration of Oscillator

The oscillator 1 according to the present embodiment is constituted by a container 10, a quartz crystal resonator 20, an IC 50, and so on.

The container 10 is constituted by a package main body 18, a lid 19, and so on. The package main body 18 is a chassis for housing the quartz crystal resonator 20, and the IC 50. The lid 19 is a lid body made of metal for covering an upper surface of the package main body 18.

The quartz crystal resonator 20 is a resonator element using a quartz crystal substrate as a piezoelectric body.

The IC 50 is an integrated circuit element (Integrated Circuit), and is configured including an oscillation circuit 30, an inductor 24, and so on.

As shown in FIG. 2, the package main body 18 is constituted by a substrate 14 forming a bottom part of the package main body 18, a first frame body 15 as a frame body forming a housing space S for the IC 50 and a support base of the quartz crystal resonator 20, a second frame body 16 as a frame body forming the housing space S for the quartz crystal resonator 20, a seam ring 17 as a bonding material to the lid 19, and so on.

The substrate 14 is provided with a two-layered configuration constituted by a second substrate 13 as a lower layer and a first substrate 11 as an upper layer in a preferred example. In the substrate 14, an obverse surface is defined as a first surface 14a, and an opposite surface to the first surface to be a reverse surface is defined as a second surface 14b. It should be noted as the substrate 14, there is used a ceramic substrate similarly to the second substrate 13 and the first substrate 11 as the upper layer. It should be noted that it is possible to use an insulating substrate material such as glass or resin, or an insulating substrate material combining these materials.

In the substrate 14, a conductor layer 12 is disposed between the first surface 14a and the second surface 14b. In other words, between the second substrate 13 and the first substrate 11 as the upper layer, there is disposed the conductor layer 12. The conductor layer 12 is a wiring pattern formed of an electrically-conductive metal material such as molybdenum (MO) or tungsten (W).

On the substrate 14, there are stacked the first frame body 15 and the second frame body 16 each shaped like a frame. An inner wall of a left part of the first frame body 15 has a step protruding toward the housing space S from an inner wall of a left part of the second frame body 16. The step in the first frame body 15 functions as a support base for supporting the quartz crystal resonator 20. The second frame body and the first frame body 15 are bonded to the first surface 14a to form the housing space S for housing the quartz crystal resonator 20 and the IC 50. The quartz crystal resonator 20 is electrically coupled to coupling interconnections 41 via respective bumps 43 as bonding members made of an electrically-conductive material such as solder, and at the same time, fixed to the step in the first frame body 15. The coupling interconnections 41 are each electrically coupled to a resonator interconnection 42 via a through hole 46 penetrating downward the inside of the first frame body 15.

An interior region having the substrate 14 as a bottom, and surrounded by the first frame body 15 and the second frame body each shaped like a frame corresponds to the housing space S. It should be noted that the material of the first frame body 15 and the second frame body 16 is substantially the same as that of the first substrate 11.

In the preferred example, as the material of the lid 19, there is used Kovar (Fe—Ni—Co alloy), and brazing with silver solder is adopted for the seam ring 17. The housing space S for the package main body 18 is provided with an inert gas atmosphere with an inert gas such as nitrogen, helium, or argon, or a reduced pressure atmosphere lower in pressure than the atmospheric pressure, and is sealed with the lid 19. Thus, the IC 50, the quartz crystal resonator 20, and so on housed in the housing space S are protected against an impact, dust, heat, moisture, and so on in good condition. It should be noted that although the illustration is omitted, the lid 19 made of metal is grounded at the ground potential.

Outline of IC and Mounting Configuration of IC

Figure 4:
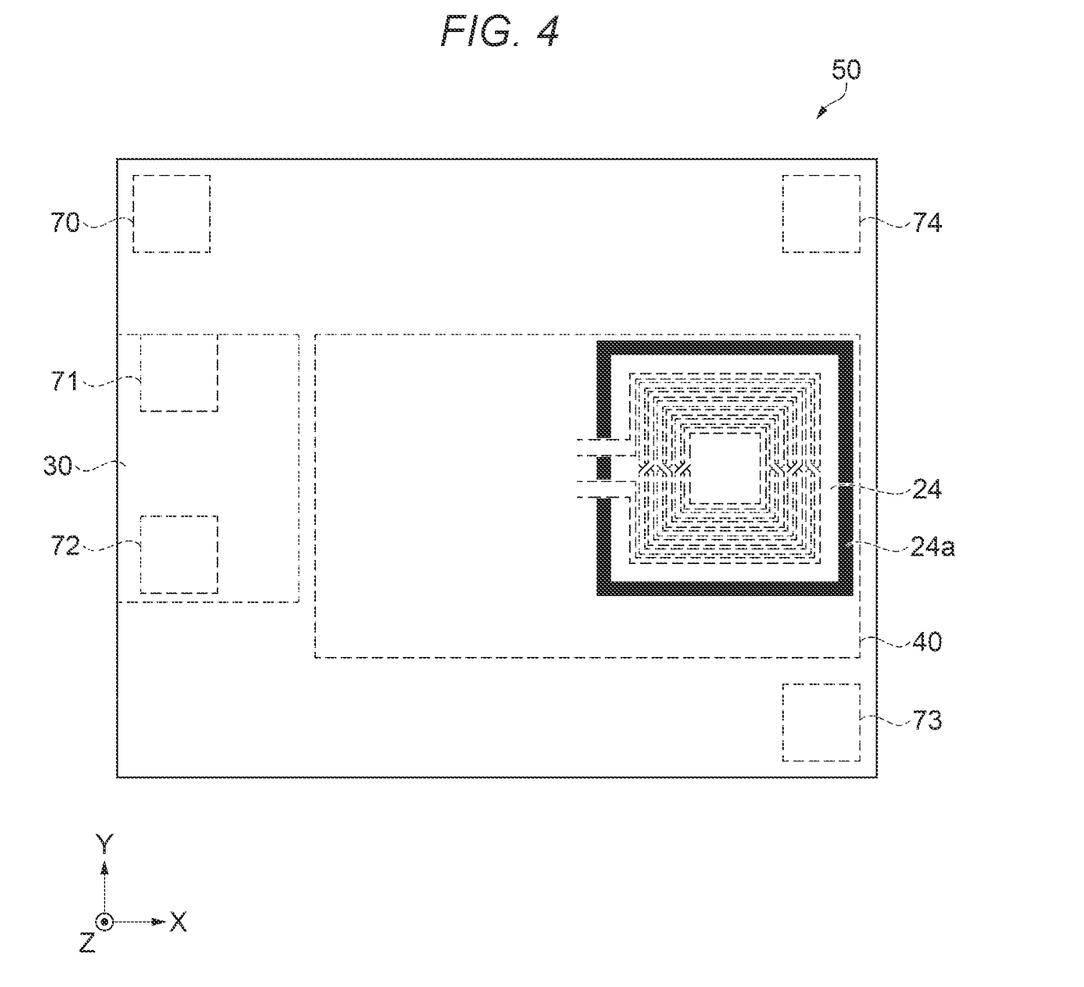
FIG. 4 is a see-through plan view of an internal configuration of an IC incorporated in the oscillator viewed from above.

FIG. 4 is a see-through plan view of the IC mounted on the substrate viewed from the lid side.

The description will be presented defining an upper surface of the substrate 14 shown in FIG. 2 and FIG. 3 as a first surface 14a, and a lower surface as a second surface 14b.

On the first surface 14a of the substrate 14, there is mounted the IC 50 face-down with an active surface facing downward. As shown in FIG. 4, a plurality of coupling pads 70 through 74 are disposed on the active surface of the IC 50. The plurality of coupling pads 70 through 74 are bonded to the wiring pattern on the first surface 14a via the bumps 43 made of an electrically-conductive material such as gold or solder.

The coupling pad 73 is a ground terminal, and is electrically coupled to the wiring pattern 80 on the first surface 14a via the bump 43 as shown in FIG. 3. The wiring pattern 80 is electrically coupled to mounting terminals 85 for mounting the oscillator 1. The mounting terminals 85 are formed on the second surface 14b and a side surface of the substrate 14, and are coupled to the wiring pattern 80 in a portion formed on the side surface.

Here, the wiring pattern 80 and the conductor layer are also electrically coupled to each other, and the conductor layer 12 is grounded at the ground potential.

As shown in FIG. 4, on the active surface of the IC 50, there are formed the oscillation circuit 30, a PLL circuit 40, and so on in addition to the plurality of coupling pads 70 through 74.

The coupling pads 71, 72 are coupling terminals for electrically coupling the oscillation circuit 30 and the quartz crystal resonator 20 to each other. As shown in FIG. 2, the coupling pads 71, 72 are electrically coupled to the resonator interconnections 42 on the first surface 14a via the bumps 43. Further, as described above, the resonator interconnections 42 are electrically coupled to the quartz crystal resonator 20 via the through holes 46 in the step part in the first frame body 15, the coupling interconnections 41, and the bumps 43, respectively. In such a manner, the resonator interconnections 42 are each coupled to the quartz crystal resonator 20 and the oscillation circuit 30 to form an oscillation loop.

The PLL circuit 40 is provided with an LC oscillation circuit including the inductor 24. In other words, as shown in FIG. 4, the IC 40 incorporates the inductor 24. It should be noted that the LC oscillation circuit is provided with a capacitor, but the illustration is omitted. In the IC 50 having a substantially rectangular planar shape, the oscillation circuit 30 is located at the center closer to the left side, and the inductor 24 having a substantially square shape is located at the center closer to the right side. The PLL circuit 40 is disposed between the oscillation circuit 30 and the right side of the IC 50.

As a preferred example of the inductor 24, there is used a spiral inductor. The spiral inductor is disposed on a surface layer of the active surface of the IC 50, and is formed by making a circuit with a wire made of metal such as aluminum a plurality of times. As described above, by making the IC 50 incorporate the inductor 24, reduction in size of the IC 50 is realized compared to the case of an external inductor.

The inductor 24 is formed by, for example, making circuits with one metal wire clockwise, and making circuits with the other metal wire counterclockwise. Further, the one metal wire and the other metal wire are laid so as to make the circuits in parallel to each other. For example, the thickness of the metal interconnections of the inductor 24 is set to a range no smaller than 1 µm and no larger than 10 µm in which the serial resistance of the inductor becomes low and the Q-value is improved, or is more preferably set to a range no smaller than 2 µm and no larger than 6 µm in which the film thickness is more easily controlled, and the deposition time is shorter. Further, on the periphery of the inductor 24, there is disposed a guard ring 24a set to a constant voltage such as a ground voltage.

It should be noted that the inductor 24 also functions as a so-called expansion coil for increasing a frequency variable range in which the frequency can be adjusted, and can therefore reduce the fluctuation of the frequency variable range before and after mounting the oscillator 1 on the substrate.

Circuit Block Configuration of Oscillator

Figure 5:
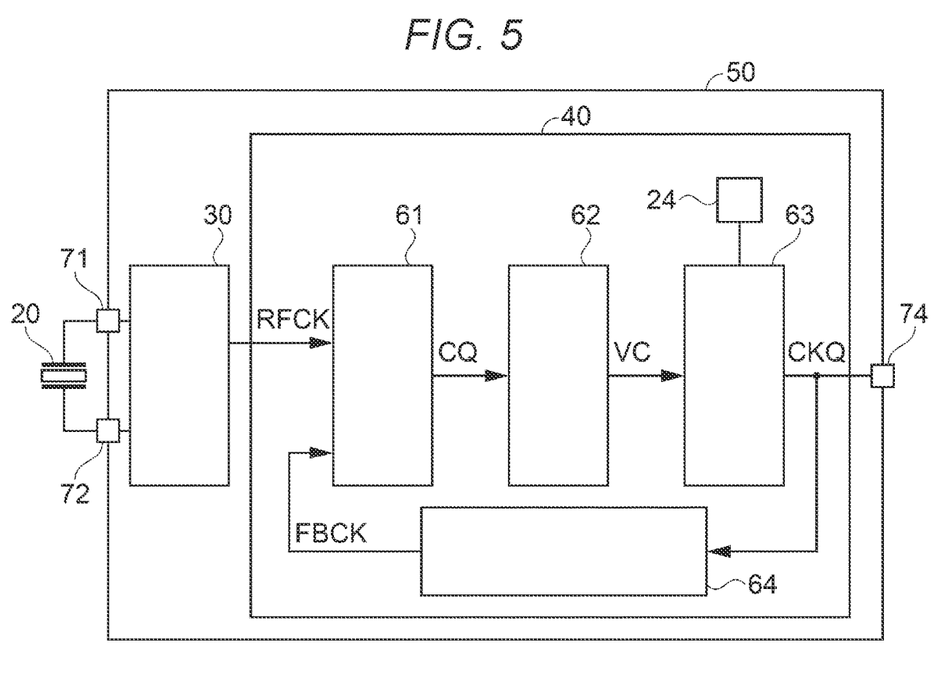
FIG. 5 is a block diagram showing a circuit configuration of the oscillator.

FIG. 5 is a circuit block configuration diagram of the oscillator.

As shown in FIG. 5, the IC 50 includes the oscillation circuit 30 and the PLL circuit 40, and electrically couples the oscillation circuit 30 and the quartz crystal resonator 20 to each other to oscillate the quartz crystal resonator 20 with the oscillation circuit 30.

The IC 50 synchronizes a reference clock signal RFCK output from the oscillation circuit 30 with a feedback clock signal FBCK obtained by dividing the reference clock signal RFCK by N in frequency using the PLL circuit 40 to thereby output a clock signal CKQ having a frequency N times as high as that of the reference clock signal RFCK from the coupling pad 74.

As shown in FIG. 5, the oscillation circuit 30 oscillates the quartz crystal resonator 20 to generate the reference clock signal RFCK as the oscillation signal. For example, when defining the frequency of the oscillation of the quartz crystal resonator 20 as fxtal, the frequency of the reference clock signal RFCK also becomes fxtal.

Then, the PLL circuit 40 is configured including a phase comparison circuit 61 for comparing a phase of the oscillation signal from the oscillation circuit 30 and a phase of a feedback signal with each other, a voltage-controlled oscillation circuit 63 the oscillation frequency of which is controlled based on an output signal from the phase comparison circuit 61, and a frequency dividing circuit 64 for dividing the frequency of the output signal from the voltage-controlled oscillation circuit 63 to generate the feedback signal.

The phase comparison circuit 61 compares a phase of the reference clock signal RFCK from the oscillation circuit 30 and a phase of the feedback clock signal FBCK with each other. Then, the phase comparison circuit 61 outputs a signal CQ corresponding to a phase difference between the reference clock signal RFCK and the feedback clock signal FBCK as a signal of a phase comparison result. The signal CQ corresponding to the phase difference means, for example, a pulse signal with a pulse width proportional to the phase difference.

A control voltage generation circuit 62 for performing processing based on the signal CQ corresponding to the phase difference from the phase comparison circuit 61 performs a charge pump operation and a filter processing based on the signal CQ corresponding to the phase difference to generate a control voltage VC for controlling the oscillation of the voltage-controlled oscillation circuit 63.

The voltage-controlled oscillation circuit 63 is an LC oscillation circuit oscillating with a resonance frequency of an LC circuit including the inductor 24 formed on the substrate of the IC 50. The LC oscillation circuit performs an oscillation action based on the control voltage VC from the control voltage generation circuit 62 to generate the clock signal CKQ. The voltage-controlled oscillation circuit 63 has a variable capacitance element such as a varactor, and varies the frequency of the clock signal CKQ as the oscillation signal generated by the oscillation action of the LC oscillation circuit in accordance with the capacitance of the variable capacitance element changing based on the control voltage VC.

The frequency dividing circuit 64 outputs the signal having the frequency obtained by dividing the frequency of the clock signal CKQ at a frequency division ratio set by frequency division ratio data as the feedback clock signal FBCK. For example, when defining the frequency of the oscillation of the voltage-controlled oscillation circuit 63 as fvco, and the frequency division ratio in the frequency dividing action of the frequency dividing circuit 64 as N, the frequency of the feedback clock signal FBCK becomes fvco/N. It should be noted that the value N can be an integer, or can also be a value including a fractional portion.

Outline of Quartz Crystal Resonator

Going back to FIG. 1, as shown in FIG. 1, the quartz crystal resonator 20 as a resonator element includes a quartz crystal substrate 21, excitation electrodes 22 disposed respectively on both of upper and lower principal surfaces of the quartz crystal substrate 21, electrode pads 26 disposed respectively on both of the upper and lower principal surfaces in one end part in the X direction of the quartz crystal substrate 21, and lead electrodes 23 for electrically coupling the excitation electrodes 22 and the electrode pads 26 to each other, respectively. In each of the electrode pads 26 disposed on both of the upper and lower principal surfaces of the quartz crystal substrate 21, the electrode pad 26 on the upper surface and the electrode pad 26 on the lower surface are electrically coupled to each other with a side surface electrode not shown. The excitation electrode 22 disposed on the upper surface of the quartz crystal substrate 21 is electrically coupled to the electrode pad 26 via the lead electrode 23 disposed on the upper surface of the quartz crystal substrate 21, and the excitation electrode 22 disposed on the lower surface of the quartz crystal substrate 21 is electrically coupled to the electrode pad 26 via the lead electrode 23 disposed on the lower surface of the quartz crystal substrate 21. Further, as shown in FIG. 2, the electrode pads 26 are each electrically coupled to the coupling interconnection 41 via the bump 43.

Arrangement of Conductor Layer

As shown in FIG. 1, the conductor layer 12 is a solid pattern disposed so as to overlap the oscillation circuit 30 of the IC 50 and the electrode pads 26 of the quartz crystal resonator 20. In the plan view, the oscillation circuit 30 is disposed between the resonator interconnections 42 and the inductor 24. The conductor layer 12 does not overlap the inductor 24. In particular, the conductor layer 12 has a cut-out shape in a portion overlapping the inductor 24 in the IC 50, and thus, fails to overlap the inductor 24. The cut-out shape is constituted by a cut-out side 12a extending in the X-axis direction and a cut-out side 12b extending in the Y-axis direction, and the inductor 24 is at a planar distance from each of the cut-out side 12a and the cut-out side 12b. In other words, the conductor layer 12 is disposed so as to surround at least two sides of the periphery of the inductor 24 in the plan view.

It should be noted that the conductor layer 12 also fails to overlap the guard ring 24a disposed on the periphery of the inductor 24 in the plan view.

In particular, the conductor layer 12 is disposed so as to overlap the oscillation circuit 30, the electrode pads of the quartz crystal resonator 20, and the resonator interconnections 42 forming the oscillation loop, but has the shape not overlapping the inductor 24. In other words, the conductor layer 12 has a pattern shape selectively covering a region forming the oscillation loop.

Advantage of Conductor Layer

Figure 6:
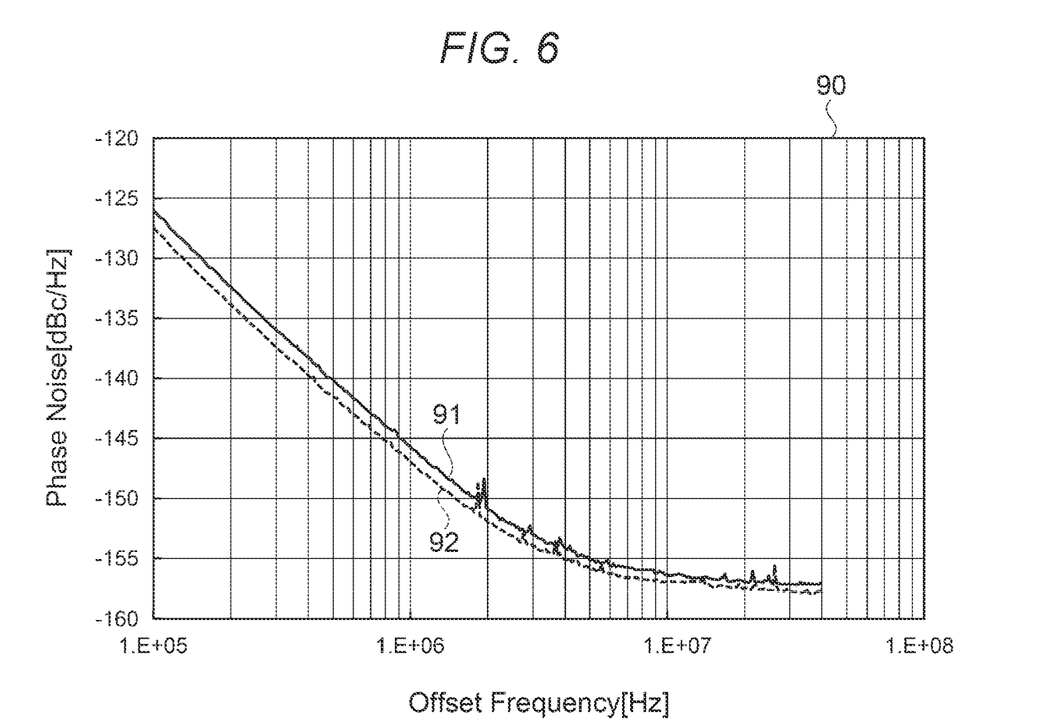
FIG. 6 is a graph showing a comparison of phase noise characteristics of the oscillator.

FIG. 6 shows a chart showing a change in phase noise characteristics in accordance with presence or absence of the conductor layer 12.

The chart 90 shown in FIG. 6 represents data obtained by measuring the characteristics of the phase noise (dBc/Hz) with respect to an offset frequency (Hz) by the oscillator 1 taking the offset frequency (Hz) in the horizontal axis and the phase noise (dBc/Hz) in the vertical axis.

The graph 91 represents the data obtained by measuring the phase noise characteristics in the state in which the conductor layer 12 is also formed in the area overlapping the inductor 24 in addition to the region forming the oscillation loop as a comparative example.

The graph 92 represents the data obtained by measuring the phase noise characteristics in the state of the configuration of the oscillator 1 according to the present disclosure in which the conductor layer 12 overlaps the region forming the oscillation loop but does not overlap the inductor 24.

A result of the comparison between the both cases shows the fact that the phase noise characteristics are improved as much as about 2 dBc/Hz in the entire area of the offset frequency as shown in the graph 92 compared to the graph 91. This is because when the conductor layer 12 at the ground potential overlaps the inductor 24, the magnetic field formed in the inductor 24 when energized is blocked by the conductor layer 12, and therefore, the characteristics of the inductor 24 deteriorate. The deterioration in characteristics of the inductor 24 affects the oscillation characteristics of the LC oscillation circuit.

Other Advantages of Conductor Layer etc.

Going back to FIG. 1, as described above, since the conductor layer 12 at the ground potential is selectively disposed so as to overlap the region forming the oscillation loop, the conductor layer 12 functions as a shield pattern to make it possible to stabilize the oscillation characteristics.

Going back to FIG. 2, as shown in FIG. 2, the IC 50 is mounted face-down on the substrate 14, and the quartz crystal resonator 20 is supported by the step part in the first frame body 15 above the IC 50. Further, the lid 19 is disposed above the quartz crystal resonator 20. In other words, the distance from the inductor 24 in the IC 50 to the lid 19 is a sum of the distance from the IC 50 to the quartz crystal resonator 20 in addition to the thickness of the IC 50, the thickness of the quartz crystal resonator 20, and the distance from the quartz crystal resonator 20 to the lid 19. In other words, the distance from the inductor 24 to the lid 19 at the ground potential is set long. In other words, the distance between the lid 19 and the first surface 14a of the substrate 14 is set longer than the distance between the conductor layer 12 and the first surface 14a. Thus, the magnetic field formed by the inductor 24 when energized is prevented from being blocked by the lid 19.

Application Examples

In the above description, a voltage-controlled crystal oscillator (VCXO) is illustrated as the oscillator 1, but the type of the resonator element and the type of the oscillator 1 are not limited thereto. As the resonator element, there can be used, for example, an SAW (Surface Acoustic Wave) resonator, an AT-cut quartz crystal resonator, an SC-cut quartz crystal resonator, other piezoelectric resonators, and an MEMS (Micro Electro Mechanical Systems) resonator.

Further, as a substrate material of the resonator element, there can be cited a piezoelectric material such as a piezoelectric single crystal including a quartz crystal, lithium tantalate, lithium niobate, and so on, and piezoelectric ceramics including lead zirconate titanate and so on, or it is possible to adopt a silicon semiconductor material to thereby be formed in the MEMS process. Further, as an excitation device for the resonator element, there can be used a device using a piezoelectric effect, or electrostatic drive using Coulomb force.

Further, the type of the oscillator 1 can be a piezoelectric oscillator (e.g., a quartz crystal oscillator), an SAW oscillator, a voltage-controlled oscillator (e.g., a VCXO or a VCSO), a temperature-compensated oscillator (e.g., a TCXO), an oven-controlled oscillator (e.g., an OCXO), a silicon oscillator, an atomic oscillator, or the like.

It should be noted that though, in the present embodiment, the description is presented using the configuration in which the IC 50 is mounted using the FCB (Flip Chip Bonding) mounting, it is possible to use a configuration of achieving the electrical coupling to the interconnections in the package via bonding wires.

As described hereinabove, according to the oscillator 1 related to the present embodiment, the following advantages can be obtained.

The substrate 14 has the conductor layer 12 between the first surface 14a and the second surface 14b, and the conductor layer 12 has the configuration of overlapping the resonator interconnections 42 in the plan view, and not overlapping the inductor 24.

Thus, it is possible to prevent the deterioration in characteristics of the inductor 24 due to the overlap of the conductor layer 12 at the ground potential with the inductor 24. In particular, it is possible to prevent the magnetic field formed by the inductor 24 when energized from being blocked by the conductor layer 12.

Therefore, the oscillation characteristics are stabilized, and it is possible to provide the oscillator 1 good in phase noise characteristics.

Further, the conductor layer 12 is grounded, and has the configuration of overlapping the oscillation circuit 30 in the plan view.

Thus, since the conductor layer 12 at the ground potential functions as the shield layer, the oscillation characteristics of the oscillator 1 are stabilized.

Further, the conductor layer 12 is disposed so as to surround at least two sides of the periphery of the inductor in the plan view. According to this configuration, it is possible to dispose the conductor layer 12 so that the conductor layer 12 does not overlap the inductor 24.

Further, the IC 50 is bonded to the first surface 14a via the bumps 43 with the active surface opposed to the first surface 14a of the substrate 14. According to this configuration, it is possible to compactly mount the IC 50 on the substrate 14.

Further, the IC 50 includes the PLL circuit 40, and the PLL circuit 40 includes the phase comparison circuit 61 for comparing the phase of the oscillation signal from the oscillation circuit 30 and the phase of a feedback signal with each other, the voltage-controlled oscillation circuit 63 the oscillation frequency of which is controlled based on the output signal from the phase comparison circuit 61, and the frequency dividing circuit 64 for dividing the frequency of the output signal from the voltage-controlled oscillation circuit 63 to generate the feedback signal, and the voltage-controlled oscillation circuit 63 is realized by the LC oscillation circuit including the inductor.

According to the above, it is possible to provide the oscillator 1 capable of obtaining a desired oscillation frequency.

Further, in the plan view, the oscillation circuit 30 is disposed between the resonator interconnections 42 and the inductor 24. According to the above, it is possible to continuously cover the oscillation circuit 30 and the resonator interconnections 42 constituting the oscillation loop with the conductor layer 12.

Further, the lid 19 is grounded, and the distance between the lid 19 and the first surface 14a of the substrate 14 is set longer than the distance between the conductor layer 12 and the first surface 14a.

According to the above, it is possible to prevent the magnetic field formed by the inductor 24 when energized from being blocked by the lid 19.

2. Embodiment 2

Then, an oscillator 1a as an electronic device according to Embodiment 2 will be described with reference to FIG. 7.

The oscillator 1a according to the present embodiment is substantially the same as the oscillator 1 according to Embodiment 1 except the point that the shape of the conductor layer 12 is different in the plan view compared to the oscillator 1 according to Embodiment 1. It should be noted that the description will be presented with a focus on the difference from Embodiment 1 described above, and the description of substantially the same issues will be omitted.

As shown in FIG. 7, it is possible for the oscillator 1a to add a conductor layer 12c to the conductor layer 12 described in Embodiment 1 to thereby dispose the conductor layer so as to surround three sides of the periphery of the inductor 24 in the plan view. Further, it is possible to add a conductor layer 12d not shown to thereby surround the four sides of the periphery of the inductor 24 in the plan view. By adopting such a configuration, the electrical coupling reliability is improved, and at the same time, it is possible to obtain an advantage the same as or greater than the advantage of the oscillator 1 according to Embodiment 1.

Further, in the plan view, it is possible for the oscillator 1a to dispose the cut-out side 12a and the cut-out side 12b across the inductor 24 from each other wherein the cut-out side 12a is a side of a rectangular shape obtained by extending the shape of the conductor layer 12 described in Embodiment 1 in parallel only to one side of the inductor 24.

Further, it is also possible to dispose the cut-out side 12b and the conductor layer 12d not shown across the inductor 24 from each other wherein the cut-out side 12b is a side of a substantially rectangular shape obtained by extending the shape of the conductor layer 12 in parallel only to another side of the inductor 24. In other words, it is sufficient for the conductor layer 12 to be disposed so as to surround at least two sides of the periphery of the inductor 24 in the plan view.

It should be noted that the conductor layer 12 also fails to overlap the guard ring 24a disposed on the periphery of the inductor 24 in the plan view similarly to Embodiment 1.

As described hereinabove, according to the oscillator 1a related to the present embodiment, the following advantages can be obtained.

Since the conductor layer 12 disposed between the first surface 14a and the second surface 14b of the substrate is disposed so as to surround the four sides of the periphery of the inductor 24, it is possible to prevent the magnetic field formed by the inductor 24 when energized from being blocked by the conductor layer 12.

Therefore, the oscillation characteristics are further stabilized, and it is possible to provide the oscillator 1a better in phase noise characteristics.

3. Embodiment 3

Then, there will be described a smartphone 100 cited as an example of an electronic apparatus according to Embodiment 3 equipped with the oscillator 1, 1a as the electronic device. It should be noted that in the following description, the description will be presented illustrating a configuration of implementing the oscillator 1.

Figure 8:
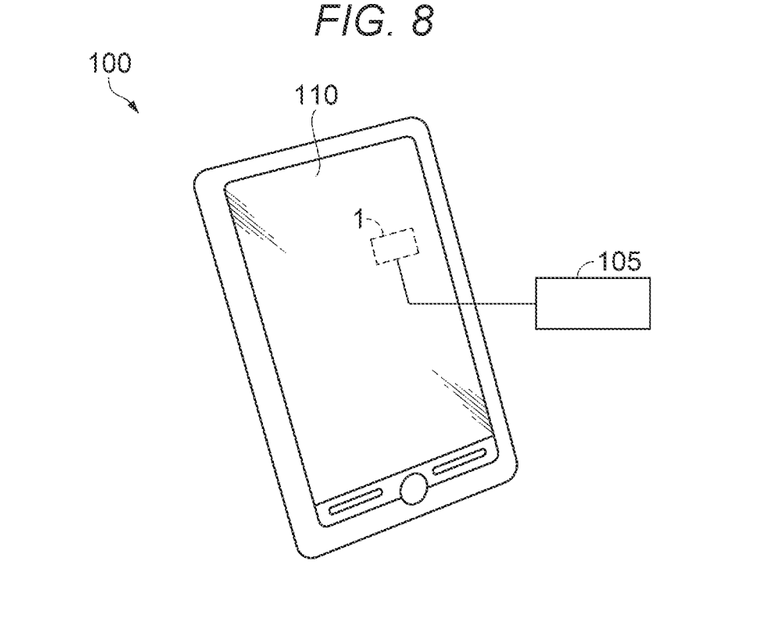
FIG. 8 is a diagram showing an electronic apparatus incorporating the oscillator according to Embodiment 3.

As shown in FIG. 8, the smartphone 100 incorporates the oscillator 1 described above.

In a control section 105 in the smartphone 100, there is incorporated the oscillator 1 which functions as a reference clock or the like for controlling a display image of a display section 110.

Such an electronic apparatus as described above is provided with the oscillator 1 described above, and is therefore excellent in performance since the advantages described in the above embodiments are reflected.

It should be noted that, as the electronic apparatus equipped with the oscillator 1 described above, there can be cited, for example, an inkjet ejection device such as an inkjet printer, a cellular phone, a personal computer such as a laptop personal computer or a mobile personal computer, a television set, a digital still camera, a video camera, a video cassette recorder, a variety of types of navigation systems, a pager, a personal digital assistance including one with communication function, an electronic dictionary, an electric calculator, a computerized game machine, a word processor, a workstation, a video phone, a security video monitor, a pair of electronic binoculars, a POS terminal, a fish detector, a variety of types of measurement instruments, gauges, a flight simulator, a medical device such as an electronic thermometer, an electronic manometer, an electronic blood sugar meter, an electrocardiogram measurement instrument, an ultrasonograph, and an electronic endoscope in addition to the smartphone 100. In any of these cases, such an electronic apparatus as described above is provided with the oscillator 1 described above, and is therefore excellent in performance since the advantages described in the above embodiments are reflected.

As described hereinabove, since the electronic apparatus equipped with the oscillator 1 according to the present embodiment is provided with the electronic component with which the stable oscillation characteristics can be obtained, it is possible to provide the electronic apparatus which is controlled by the stable electronic component, and is therefore high in reliability.

4. Embodiment 4

Then, there will be described a car 150 cited as an example of a vehicle according to Embodiment 4 equipped with the oscillator 1, 1a as the electronic device. It should be noted that in the following description, the description will be presented illustrating a configuration of implementing the oscillator 1.

Figure 9:
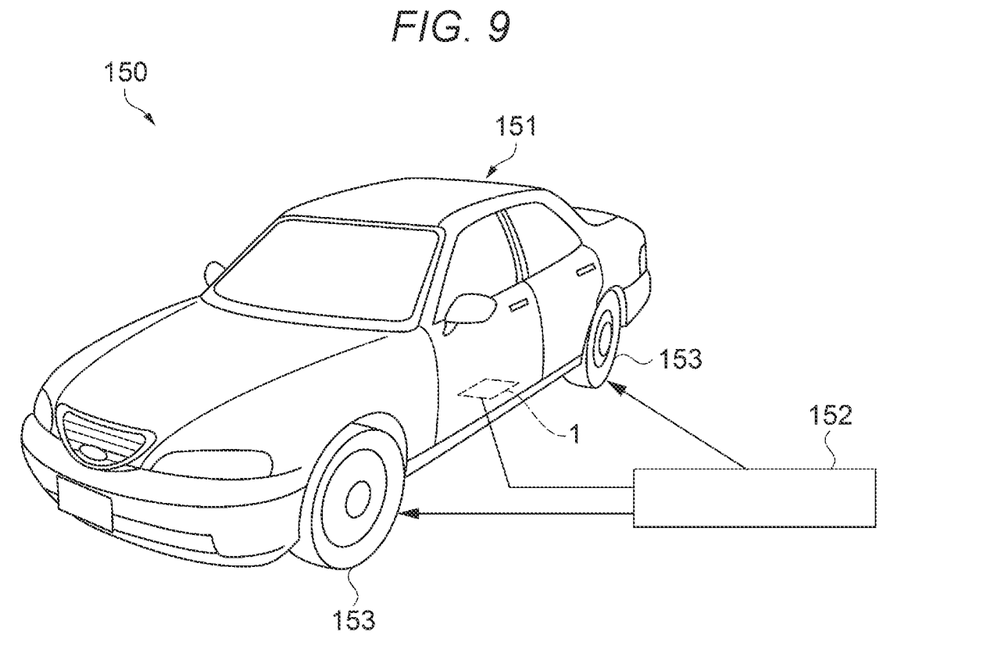
FIG. 9 is a diagram showing a vehicle incorporating the oscillator according to Embodiment 4.

As shown in FIG. 9, the car 150 incorporates the oscillator 1 described above. In a car body 151 of the car 150, there is installed the oscillator 1 which functions as a reference clock or the like for an electronic control unit 152 for controlling tires 153. Further, the oscillator 1 can widely be applied to an electronic control unit (ECU) such as a keyless entry system, an immobilizer, a car navigation system, a car air-conditioner, an anti-lock braking system (ABS), an airbag system, a tire pressure monitoring system (TPMS), an engine control system, a controller of an inertial navigation for an automated cruise, or a battery monitor for a hybrid car or an electric car, besides the above.

Further, besides the illustrations described above, the oscillator 1 to be applied to the vehicle can be used in, for example, attitude control of a two-legged robot, an electric train, and so on, remote control of a radio control airplane, a radio control helicopter, a drone, and so on, attitude control of an autonomous flight vehicle, attitude control of an agricultural machine, a construction machine, and so on, and in any of these cases, it is possible to provide the vehicle in which the advantages described in the above embodiments are reflected, and which is therefore excellent in performance.

As described hereinabove, since the vehicle equipped with the oscillator 1 according to the present embodiment is provided with the electronic component with which the stable oscillation characteristics can be obtained, it is possible to provide the vehicle which is controlled by the stable electronic component, and is therefore high in reliability.

What is claimed is:

1. An oscillator comprising:
   an integrated circuit element having an oscillation circuit to electrically be coupled to a resonator element, and an inductor; and
   a substrate having a first surface on which the integrated circuit element is disposed, and on which a resonator interconnection to be coupled to the resonator element and the oscillation circuit to constitute an oscillation loop is disposed, and a second surface as an opposite surface to the first surface, wherein
   the substrate has a conductor layer between the first surface and the second surface,
   the conductor layer overlaps the resonator interconnection, and does not overlap the inductor in a plan view, and
   the conductor layer overlaps the oscillation circuit in the plan view.

2. The oscillator according to claim 1, wherein the integrated circuit element is bonded to the first surface via an electrically-conductive bonding member with an active surface opposed to the first surface.

3. The oscillator according to claim 1, wherein the integrated circuit element includes a PLL circuit, the PLL circuit includes
   a phase comparison circuit configured to compare a phase of an oscillation signal from the oscillation circuit and a phase of a feedback signal with each other,
   a voltage-controlled oscillation circuit an oscillation frequency of which is controlled based on an output signal from the phase comparison circuit, and
   a frequency dividing circuit configured to divide a frequency of an output signal from the voltage-controlled oscillation circuit to generate the feedback signal, and the voltage-controlled oscillation circuit is an LC oscillation circuit including the inductor.

4. The oscillator according to claim 1, wherein the oscillation circuit is disposed between the resonator interconnection and the inductor in the plan view.

5. The oscillator according to claim 1, further comprising:
   a frame body which is bonded to the first surface to form a housing space configured to house the resonator element and the integrated circuit element; and
   a lid body which is made of metal, which is bonded to the frame body, and which is configured to cover the housing space, wherein
   the lid body is grounded, and
   a distance between the lid body and the first surface is longer than a distance between the conductor layer and the first surface.

6. An electronic apparatus comprising:
   the oscillator according to claim 1.

7. A vehicle comprising:
   the oscillator according to claim 1.

8. An oscillator comprising:
   an integrated circuit element having an oscillation circuit to electrically be coupled to a resonator element, and an inductor, and
   a substrate having a first surface on which the integrated circuit element is disposed and on which a resonator interconnection to be coupled to the resonator element and the oscillation circuit to constitute an oscillation loop is disposed, and a second surface as an opposite surface to the first surface, wherein
   the substrate has a conductor layer between the first surface and the second surface,
   the conductor layer overlaps the resonator interconnection, and does not overlap the inductor in a plan view, and
   the conductor layer is disposed so as to surround at least two sides of a periphery of the inductor in the plan view.

9. An oscillator comprising:
   an integrated circuit element having an oscillation circuit to electrically be coupled to a resonator element, and an inductor; and
   a substrate having a first surface on which the integrated circuit element is disposed and on which a resonator interconnection to be coupled to the resonator element and the oscillation circuit to constitute an oscillation loop is disposed, and a second surface as an opposite surface to the first surface, wherein
   the substrate has a conductor layer between the first surface and the second surface,
   the conductor layer overlaps the resonator interconnection, and does not overlap the inductor in a plan view, and
   the conductor layer is grounded.

* * * * *